United States Patent
Qu

(10) Patent No.: US 10,043,831 B2
(45) Date of Patent: Aug. 7, 2018

(54) ARRAY SUBSTRATE AND MANUFACTURING METHOD THEREOF AND DISPLAY PANEL

(71) Applicants: BOE Technology Group Co., Ltd., Beijing (CN); Beijing BOE Optoelectronics Technology Co., Ltd., Beijing (CN)

(72) Inventor: Lianjie Qu, Beijing (CN)

(73) Assignees: BOE Technology Group Co., Ltd., Beijing (CN); Beijing BOE Optoelectronics Technology Co., Ltd., Beijing (CN)

(*) Notice: Subject to any disclaimer, the term of this patent is extended or adjusted under 35 U.S.C. 154(b) by 20 days.

(21) Appl. No.: 14/892,459

(22) PCT Filed: Jun. 18, 2015

(86) PCT No.: PCT/CN2015/081740
§ 371 (c)(1),
(2) Date: Nov. 19, 2015

(87) PCT Pub. No.: WO2016/090886
PCT Pub. Date: Jun. 16, 2016

(65) Prior Publication Data
US 2016/0358937 A1    Dec. 8, 2016

(30) Foreign Application Priority Data
Dec. 11, 2014 (CN) .......................... 2014 1 0768516

(51) Int. Cl.
*H01L 29/10* (2006.01)
*H01L 21/00* (2006.01)
(Continued)

(52) U.S. Cl.
CPC ........ *H01L 27/124* (2013.01); *H01L 27/1225* (2013.01); *H01L 27/1288* (2013.01); *H01L 29/66969* (2013.01); *H01L 29/7869* (2013.01)

(58) Field of Classification Search
CPC .................................................... H01L 27/1214
(Continued)

(56) References Cited

U.S. PATENT DOCUMENTS

| 5,548,425 A | 8/1996 | Adachi et al. |
| 6,734,925 B1 * | 5/2004 | Lee ........................ G02F 1/1345 349/40 |

(Continued)

FOREIGN PATENT DOCUMENTS

| CN | 1604702 A | 4/2005 |
| CN | 1623117 A | 6/2005 |

(Continued)

OTHER PUBLICATIONS

Sep. 11, 2015—International Search Report and Written Opinion Appn PCT/CN2015/081740 with English Tran.

(Continued)

*Primary Examiner* — Igwe U Anya
(74) *Attorney, Agent, or Firm* — Banner & Witcoff, Ltd.

(57) ABSTRACT

An array substrate and manufacturing method thereof and a display panel are disclosed. The manufacturing method of an array substrate includes: forming patterns of a thin film transistor, a planarization layer and a passivation layer on a base substrate, the pattern of the thin film transistor including patterns of a gate electrode, a gate insulation layer, an active layer and source and drain electrodes; patterns of the planarization layer and the passivation layer are formed by one patterning process. With the manufacturing method of the array substrate, the number of patterning processes during manufacturing of the array substrate can be (Continued)

decreased. Furthermore, the size of via holes in the planarization layer and the passivation layer can be decreased, thereby increasing the aperture ratio of the display device and enhancing the display effect of images.

18 Claims, 7 Drawing Sheets

(51) Int. Cl.
    *H01L 27/12*     (2006.01)
    *H01L 29/786*    (2006.01)
    *H01L 29/66*     (2006.01)

(58) Field of Classification Search
    USPC .......................................... 257/43; 438/149
    See application file for complete search history.

(56) References Cited

U.S. PATENT DOCUMENTS

| | | | | |
|---|---|---|---|---|
| 9,379,031 | B2* | 6/2016 | Lee | G02F 1/1309 |
| 2008/0284969 | A1* | 11/2008 | Lim | G02F 1/1345 |
| | | | | 349/152 |
| 2009/0046230 | A1* | 2/2009 | Sakurai | G02F 1/133345 |
| | | | | 349/138 |
| 2011/0050551 | A1* | 3/2011 | Ota | G02F 1/134363 |
| | | | | 345/87 |
| 2013/0126876 | A1* | 5/2013 | Shin | H01L 29/6675 |
| | | | | 257/59 |
| 2014/0118639 | A1* | 5/2014 | Matsushima | G02F 1/13338 |
| | | | | 349/12 |
| 2014/0197417 | A1* | 7/2014 | Nanai | H01L 27/3246 |
| | | | | 257/72 |
| 2015/0029433 | A1* | 1/2015 | Takizawa | G02F 1/1345 |
| | | | | 349/43 |
| 2015/0187896 | A1* | 7/2015 | Kamineni | H01L 29/41791 |
| | | | | 257/288 |
| 2015/0279859 | A1 | 10/2015 | Chen et al. | |
| 2015/0340415 | A1* | 11/2015 | Qi | H01L 27/1259 |
| | | | | 257/40 |
| 2015/0378486 | A1* | 12/2015 | Yu | G06F 3/0412 |
| | | | | 345/174 |

FOREIGN PATENT DOCUMENTS

| | | |
|---|---|---|
| CN | 101097941 A | 1/2008 |
| CN | 103762245 A | 4/2014 |
| CN | 103928472 A | 7/2014 |
| CN | 103928475 A | 7/2014 |
| CN | 104076564 A | 10/2014 |
| CN | 104091785 A | 10/2014 |
| CN | 104465510 A | 3/2015 |

OTHER PUBLICATIONS

Oct. 27, 2016—(CN) First Office Action Appn 201410768516.0 with English Tran.

Jun. 23, 2017—(CN) Office Action, Application 201410768516.0 with English translation.

Jun. 23, 2017—(CN) Second Office Action Appn 201410768516.0 With English Tran.

\* cited by examiner

ARRAY SUBSTRATE AND MANUFACTURING METHOD THEREOF AND DISPLAY PANEL

The application is a U.S. National Phase Entry of International Application No. PCT/CN2015/081740 filed on Jun. 18, 2015, designating the United States of America and claiming priority to Chinese Patent Application No. 201410768516.0, filed on Dec. 11, 2014. The present application claims priority to and the benefit of the above-identified applications and the above-identified applications are incorporated by reference herein in their entirety.

TECHNICAL FIELD

Embodiments of the present invention relate to an array substrate and a manufacturing method thereof and a display panel.

BACKGROUND

Thin film transistor liquid crystal displays (TFT-LCDs) belong to a major kind of display devices. With the development of technology, consumers have higher requirements on the display effect of electronic products. In order to improve the display effect of a display device, enhance the display performance of a thin film transistor, and reduce power consumption, a resin planarization layer is usually formed on the thin film transistor.

But generally when a pattern of a planarization layer and a pattern of a passivation layer are formed, it is necessary for them to be formed through two patterning processes. Because a thickness of the planarization layer is relatively large compared with a thickness of the passivation layer, as illustrated in FIG. 1, the aperture of a via hole in the planarization layer is relatively large. Whether a half-overlay or a full-overlay manner is adopted for the via holes 11 in the passivation layer and the planarization layer, two via holes 11 in the planarization layer and the passivation layer will be made to be too large. Thus, the via holes 11 in the planarization layer and the passivation layer cannot be overlapped completely, which greatly reduces the aperture ratio of the display device. Thereby, the display effect of images is affected.

SUMMARY

According to embodiments of the present invention, there are provided an array substrate and manufacturing method thereof and a display panel, capable of decreasing the number of patterning processes during manufacturing of the array substrate. Furthermore, the size of via holes on a planarization layer and a passivation layer can be reduced, aperture ratio of the display device can be increased, and display effect of images can be enhanced.

According to an embodiment of the present invention, there is provided a manufacturing method of an array substrate, which includes: forming patterns of a thin film transistor, a planarization layer and a passivation layer on a base substrate, pattern of the thin film transistor including patterns of a gate electrode, a gate insulation layer, an active layer and source and drain electrodes, wherein patterns of the planarization layer and the passivation layer are formed by one patterning process.

For example, the method further includes: after the pattern of the passivation layer is formed, forming a pattern of a pixel electrode layer that is connected to the drain electrode.

For example, the method further includes: forming a pattern of a data line layer, the base substrate including a display region and a peripheral region that adjoins and surrounds the display region, the pattern of the data line layer including a pattern of a data line provided in the display region and a lead pattern provided in the peripheral region, the lead pattern of the data line layer including a plurality of first leads arranged along a first direction and a plurality of second leads arranged along a second direction, and the first direction and the second direction being two different directions on a plane in parallel to the base substrate, wherein between the first leads or the second leads of the data line layer, connection is realized by lead connection lines of the pixel electrode layer provided in the peripheral region.

For example, the method further includes: forming a pattern of a common electrode layer on pattern of the planarization layer, wherein forming of the patterns of the planarization layer and the passivation layer includes: forming a thin film of a planarization layer material on the pattern of the thin film transistor; forming a thin film of a passivation layer material on the pattern of the common electrode layer; with one patterning process, forming the thin film of the planarization layer material to a pattern of the planarization layer, and forming the thin film of the passivation layer material to a pattern of the passivation layer.

For example, forming of patterns of the planarization layer and the passivation layer includes: forming a plurality of via holes in the thin film of the planarization layer material and the thin film of the passivation layer material.

For example, forming of the thin film of the planarization layer material to the pattern of the planarization layer and the thin film of the passivation layer material to the pattern of the passivation layer with one patterning process includes: coating a layer of photoresist on the substrate with the thin film of the planarization layer material and the thin film of the passivation layer formed thereon; conducting exposure of the photoresist with a mask, and then performing development on the exposed photoresist, so that a photoresist fully-retained region and a photoresist fully-removed region are formed after development; wherein, the photoresist fully-removed region corresponds to region of the drain electrode, and a rest region is the photoresist fully-retained region; removing the thin film of the planarization layer material and the thin film of the passivation layer material provided in the photoresist fully-removed region; and removing the remaining photoresist.

For example, the method further includes: forming a pattern of a common electrode layer with one patterning process on the thin film of the planarization layer material.

For example, a material for the planarization layer is a resin material.

For example, a material for the passivation layer is silicon nitride or a transparent, organic resin material.

According to an embodiment of the invention, there is further provided an array substrate, comprising a thin film transistor, a planarization layer and a passivation layer that are disposed on a base substrate, the thin film transistor including a gate electrode, a gate insulation layer, an active layer and source and drain electrodes, wherein via holes in the planarization layer and the passivation layer in correspondence with the drain electrode are smoothly connected.

For example, the array substrate further includes a pixel electrode layer disposed on the passivation layer and connected to the drain electrode and a pattern of a data line layer disposed on the base substrate, the base substrate including a display region and a peripheral region that adjoins and surrounds the display region, the pattern of the data line layer including pattern of a data line provided in the display region and a lead pattern provided in the peripheral region, the lead pattern of the data line layer including a plurality of first leads arranged along a first direction and a plurality of second leads arranged along a second direction, and the first direction and the second direction being two different directions on a plane in parallel to the base substrate, wherein between the first leads or the second leads of the data line layer, connection is realized by lead connection lines of the pixel electrode layer provided in the peripheral region.

For example, the pattern of the data line layer is disposed in the same layer as the source and drain electrodes.

For example, the pattern of the data line layer is disposed in the same layer as the gate electrode.

According to an embodiment of the invention, there is further provided a display panel, comprising any one of the above-mentioned array substrates.

BRIEF DESCRIPTION OF THE DRAWINGS

In order to illustrate the technical solution in the embodiments of the invention or prior art more clearly, the drawings needed to be used in description of the embodiments or prior art will be briefly introduced below; it is obvious that the drawings as described below are only related to some embodiments of the invention, and for those ordinarily skilled in the art, other drawings can also be obtained by them from these drawings without any creative work.

REFERENCE NUMERALS

1—a gate line; 2—a data line; 3—an active layer; 4—a pixel electrode layer; 5—a base substrate; 6—a gate insulation layer; 7—a drain electrode; 8—a planarization layer; 9—a passivation layer; 10—a photoresist; 80—a thin film of a planarization layer material; 90—a thin film of a passivation layer material; 11—a via hole; 14—a second lead; 15—a first lead; 16—a lead connection line of a pixel electrode layer provided in peripheral region; 17—a common electrode layer; 18—a thin film transistor; 19—pattern of a data line; 20—a display region; 21—a peripheral region.

DETAILED DESCRIPTION

Hereinafter, the technical solutions in the embodiments of the invention will be described in a clearly and fully understandable way in connection with the drawings in the embodiments of the invention. It is obvious that the described embodiments are just a part but not all of the embodiments of the invention. Based on the embodiments in the invention, those ordinarily skilled in the art can obtain other embodiment(s), without any inventive work, which should be within the scope sought for protection by the invention.

Figure 1:
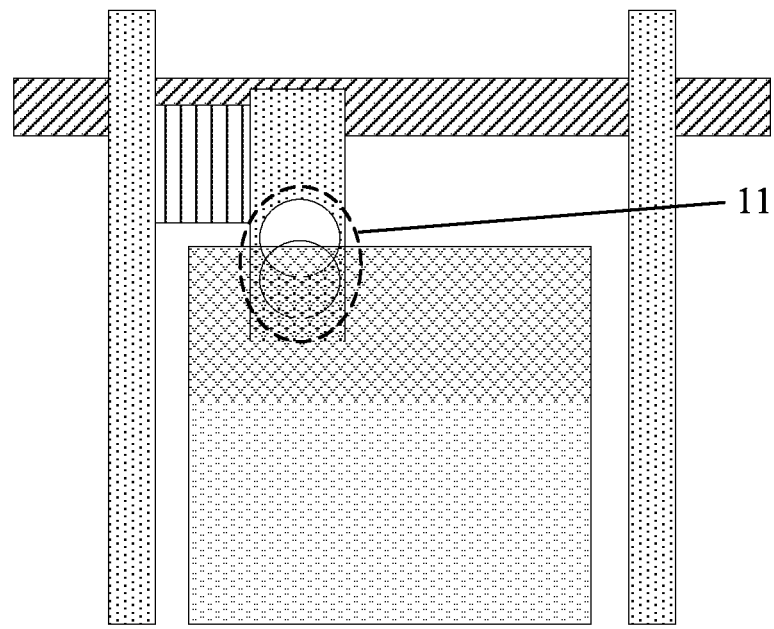
FIG. 1 is a structurally schematic top view illustrating a pixel unit on an array substrate.
Figure 2:
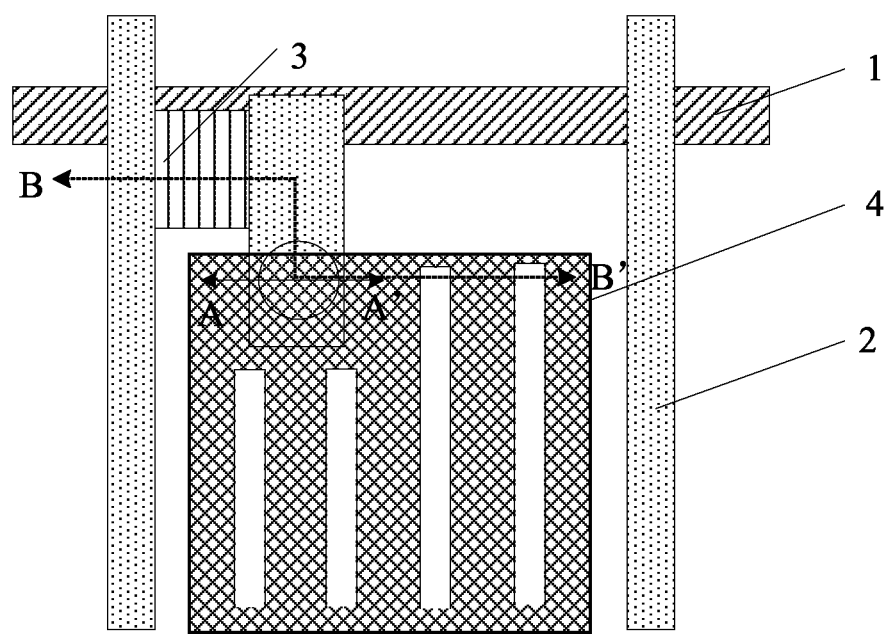
FIG. 2 is a structurally schematic top view illustrating a pixel unit on an array substrate provided by an embodiment of the invention.
Figure 3A:
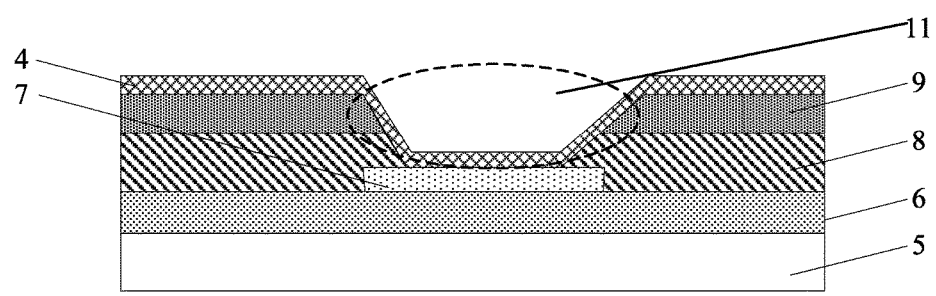
FIG. 3a is a structurally schematic section view of the array substrate as illustrated in FIG. 2 taken along line A-A'.
Figure 3B:
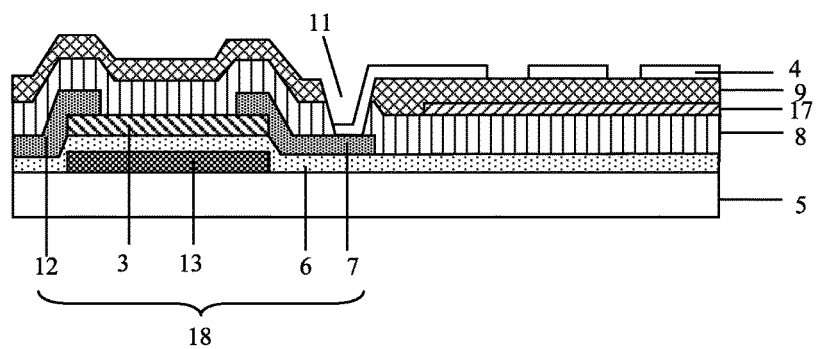
FIG. 3b is a structurally schematic section view of the array substrate as illustrated in FIG. 2 taken along line B-B'.

A schematic top view of an array substrate is illustrated in FIG. 2. A section view of the array substrate as illustrated in FIG. 2 taken along line A-A' in FIG. 2 is illustrated in FIG. 3a. FIG. 3b is a structurally schematic section view of the array substrate as illustrated in FIG. 2 taken along line B-B'. As illustrated in FIG. 2, the array substrate includes: a gate line 1, a data line 2, an active layer 3, and a pixel electrode layer 4. As illustrated in FIG. 3b, the array substrate includes: a gate electrode 13 disposed on a base substrate 5, a gate insulation layer 6 covering the gate electrode, an active layer 3 provided on the gate insulation layer 6, a source electrode 12 and a drain electrode 7 that are provided on the active layer 3, a planarization layer 8 provided on the source and drain electrodes; a common electrode layer 17 provided on the planarization layer 8, a passivation layer 9 provided on the common electrode layer 17, and a pixel electrode layer 4 provided on the passivation layer 8. A method of manufacturing an array substrate provided by an embodiment of the invention will be given below, but the present invention is not limited to the array substrate with the illustrated structure.

It is to be noted that, the so-called "patterning process" refers to a process by which a thin film is formed to be a layer containing at least one pattern. While the patterning process usually includes: coating a layer of photoresist on a thin film, conducting exposure on the photoresist with a mask, then removing the photoresist needed to be removed with a developing solution, next, etching away part of the thin film that is not covered by the photoresist, and finally, removing the remaining photoresist. While in all embodiments of the invention, "one patterning process" means that the number of exposure process contained in the patterning process is just one.

According to an embodiment of the invention, there is provided a manufacturing method of an array substrate, which includes forming patterns of a thin film transistor, a planarization layer and a passivation layer on a base substrate, the pattern of the thin film transistor including patterns of a gate electrode, a gate insulation layer, an active layer and source and drain electrodes, and patterns of the planarization layer and the passivation layer are formed by one patterning process.

For example, the method further includes forming a pattern of a common electrode layer on the pattern of the planarization layer, and forming of the patterns of the planarization layer and the passivation layer includes: forming a thin film of a planarization layer material on pattern of the thin film transistor; forming a thin film of a passivation layer material on pattern of the common electrode layer.

With one patterning process, the thin film of the planarization layer material is formed to be a pattern of the planarization layer, and the thin film of the passivation layer material is formed to be a pattern of the passivation layer.

It is to be noted that the thin film transistor may be of a top gate type or may be of a bottom gate type, and there is no limitation in this way. In an embodiment of the invention, bottom-gate thin film transistors will be described as an example. The top gate and the bottom gate are defined by the relative positions of a gate electrode and a gate insulation layer, namely, with respect to a base substrate, if the gate electrode is close to the base substrate and the gate insulation layer is far away from the base substrate, it is a bottom-gate thin film transistor. If the gate electrode is far away from a base substrate, and the gate insulation layer is close to the base substrate, it is a top-gate thin film transistor.

Figure 4:
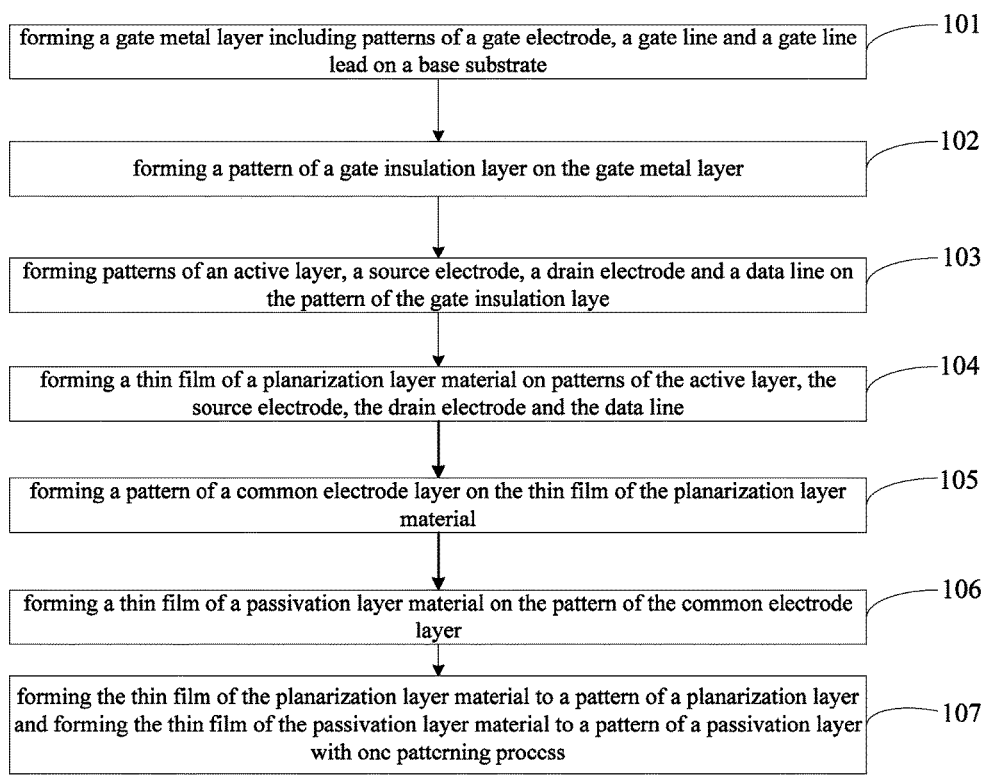
FIG. 4 is a schematic flowchart illustrating the manufacturing method of an array substrate provided by an embodiment of the invention.

An embodiment will be provided below so as to describe a manufacturing procedure of the above array substrate in detail. As illustrated in FIG. 4, the description will be given with reference to an example in which the thin film transistor is a bottom-gate thin film transistor, and a manufacturing method of the array substrate includes the following steps.

Step 101, a gate metal layer including patterns of a gate electrode, a gate line and a gate-line lead is formed on a base substrate.

For example, it is possible that by means of magnetron sputtering, a layer of metal thin film with a thickness of 1000 Å to 7000 Å is deposited on a substrate, such as a glass substrate or a quartz substrate. For the metal thin film, molybdenum, aluminum, aluminum-nickel alloy, molybdenum-tungsten alloy, chromium, copper or other metal may usually be adopted, and a composite structure of thin films of the above-mentioned materials may also be used. After that, with a mask and by exposure, development, etching, removing and other treatment of a patterning process, a gate metal layer is formed on a given region of the substrate.

Step 102, a pattern of a gate insulation layer is formed on the gate metal layer.

For example, by a chemical vapor deposition method or a magnetron sputtering method, a gate insulation layer thin film with a thickness of 1000 Å to 6000 Å may be deposited on the glass substrate, and a material for the gate insulation layer thin film is usually silicon nitride, and silicon oxide, silicon oxynitride or the like may also be used for the gate insulation layer.

Step 103, patterns of an active layer, a source electrode, a drain electrode and a data line are formed on the pattern of the gate insulation layer.

For example, by a chemical vapor deposition method, a thin film of a metal oxide semiconductor or a silicon nitride material may be deposited on the gate insulation layer, and then one patterning process is performed on the thin film of the metal oxide semiconductor or the silicon nitride material so as to form an active layer. Namely, after a layer of photoresist is coated, a pattern of the active layer can be formed only by performing exposure, development and etching on the substrate with a mask.

Further, for example, in a way similar to the manufacturing method of a gate line, a metal thin film with a thickness of 1000 Å to 7000 Å that is similar to the gate metal is deposited on the substrate. Patterns of a source electrode, a drain electrode and a data line are formed in a given region by a patterning process.

Step 104, a thin film of a planarization layer material is formed on patterns of the active layer, the source electrode, the drain electrode and the data line.

Step 105, a pattern of a common electrode layer is formed on the thin film of the planarization layer material.

For example, by a magnetron sputtering method, indium tin oxide (ITO) or indium-doped zinc oxide (IZO) is deposited on the thin film of the planarization layer material, and next, after a layer of photoresist is coated, a pattern of a common electrode layer is formed by exposure, development and etching with a common mask.

Step 106, a thin film of a passivation layer material is formed on the pattern of the common electrode layer.

For example, by means of chemical vapor deposition, a thin film of a planarization layer material and a thin film of a passivation layer material are formed. The material for the thin film of the passivation layer material is usually silicon nitride or a transparent, organic resin material, the material for the thin film of the planarization layer material is usually a resin material, and a thickness of the thin film of the passivation layer material is in the range of 1000 Å to 6000 Å.

Step 107, with one patterning process, the thin film of the planarization layer material is formed to be a pattern of a planarization layer, and thin film of the passivation layer material is formed to be a pattern of the passivation layer.

With the manufacturing method of the array substrate provided by an embodiment of the invention, a planarization layer and a passivation layer are formed by one patterning process, and compared with the common case where two patterning processes are required for formation of a planarization layer and a passivation layer, the number of patterning processes during the course of manufacturing the array substrate can be decreased. Furthermore, sizes of via holes in the planarization layer and the passivation layer can be decreased, thereby increasing the aperture ratio of the display device, and enhancing the display effect of images.

Figure 5:
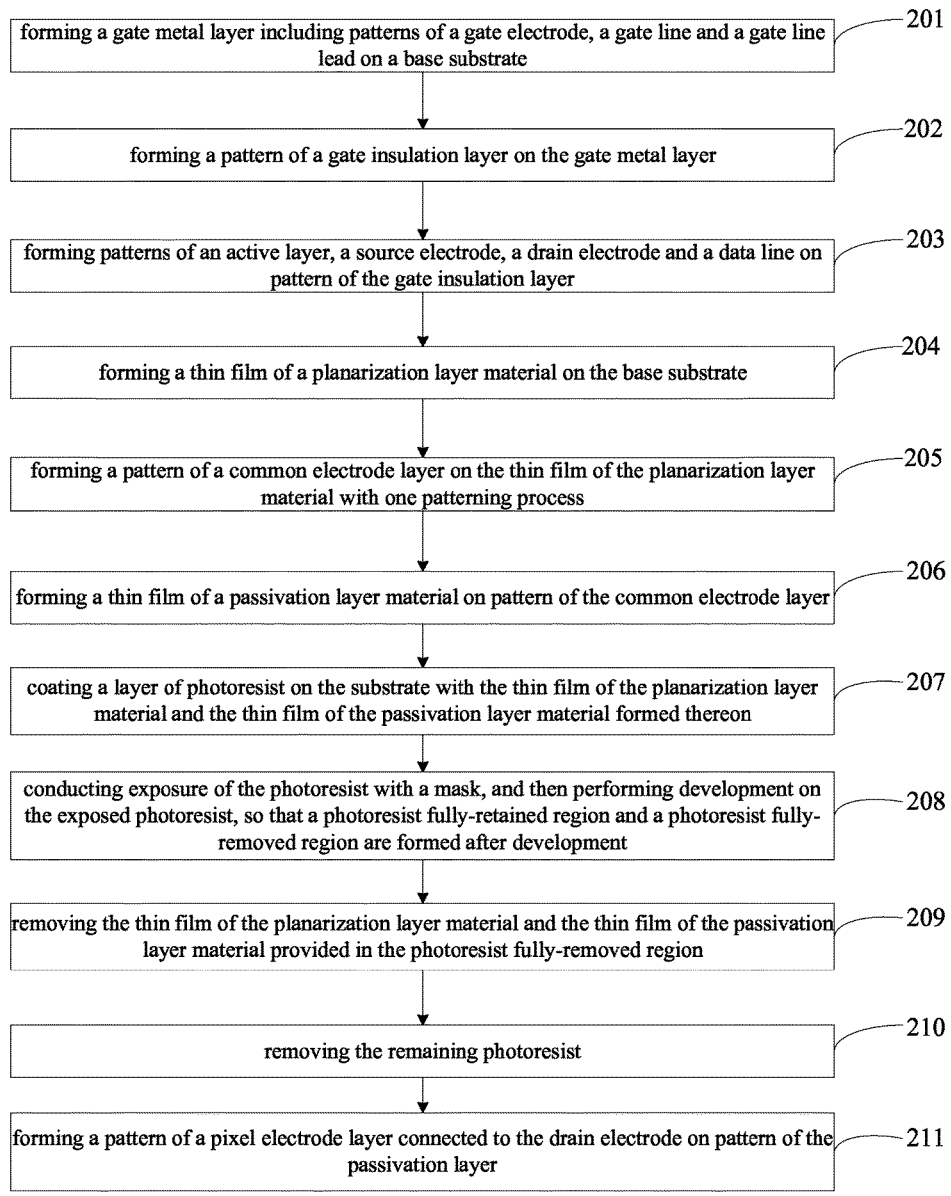
FIG. 5 is a schematic flowchart illustrating the manufacturing method of another array substrate provided by an embodiment of the invention.

An embodiment will be provided below, so as to describe a manufacturing procedure of the above array substrate in detail. As illustrated in FIG. 5, the description will be given to an example in which the thin film transistor is a bottom-gate thin film transistor, and a manufacturing method of the array substrate includes the following steps:

Step 201, a gate metal layer including patterns of a gate electrode, a gate line and a gate-line lead is formed on a base substrate.

For example, by means of magnetron sputtering, a layer of metal thin film with a thickness of 1000 Å to 7000 Å may be deposited on a substrate, such as a glass substrate or a quartz substrate. For the metal thin film, molybdenum, aluminum, aluminum-nickel alloy, molybdenum-tungsten alloy, chromium, copper or other metal may usually be adopted, and a composite structure of thin films of the above-mentioned materials may also be used. After that, with a mask and by exposure, development, etching, removing and so on of a patterning process, a gate metal layer is formed on a given region of the substrate.

Step 202, a pattern of a gate insulation layer is formed on the gate metal layer.

For example, by a chemical vapor deposition method or a magnetron sputtering method, a gate insulation layer thin film with a thickness of 10001 Å to 6000 Å may be deposited on the glass substrate, and a material for the gate insulation layer thin film is usually silicon nitride, and silicon oxide, silicon oxynitride or the like may also be used for the gate insulation layer.

Step 203, patterns of an active layer, a source electrode, a drain electrode and a data line are formed on pattern of the gate insulation layer.

For example, by a chemical vapor deposition method, a thin film of a metal oxide semiconductor or a silicon nitride material is deposited on the gate insulation layer, and then one patterning process is performed on the thin film of the metal oxide semiconductor or the silicon nitride material so as to form an active layer. Namely, after a layer of photoresist is coated, a pattern of the active layer can be formed only by performing exposure, development and etching on the substrate with a mask.

Further, for example, a way similar to the manufacturing method of a gate line may be used to deposit a metal thin film with a thickness of 1000 Å to 7000 Å that is similar to the gate metal on the substrate. Patterns of a source electrode, a drain electrode and a data line are formed in a given region by a patterning process.

Step 204, a thin film of a planarization layer material is formed on the base substrate.

For example, by means of chemical vapor deposition, a thin film of a planarization layer material is formed on the source electrode, the drain electrode and the data line, and an exemplary material for the thin film of the planarization layer material may be a resin material.

Step 205, a pattern of a common electrode layer is formed on the thin film of the planarization layer material with one patterning process.

For example, by using a magnetron sputtering method, ITO or IZO is deposited on the thin film of the planarization layer material, and next, after a layer of photoresist is coated, pattern of a common electrode layer is formed by exposure, development and etching with a common mask.

Step 206, a thin film of a passivation layer material is formed on pattern of the common electrode layer.

For example, by means of chemical vapor deposition, a thin film of a passivation layer material with a thickness of 1000 Å to 6000 Å is coated on the common electrode layer, and the material for it is usually silicon nitride or a transparent, organic resin material.

Step 207, a layer of photoresist is coated on the substrate with the thin film of the planarization layer material and the thin film of the passivation layer material formed thereon.

Figure 6:
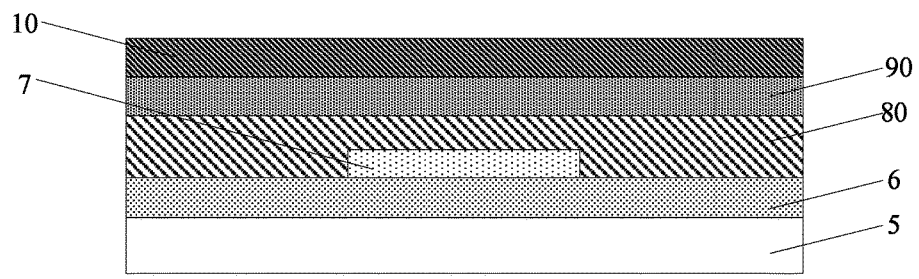
FIG. 6 is a schematic view after a layer of photoresist is coated on a thin film of a planarization layer material and a thin film of a passivation layer material, during the course of manufacturing the array substrate as illustrated in FIG. 3a or FIG. 3b.

For example, by means of deposition, a thin film of a planarization layer material is formed on the source electrode and the drain electrode, then a thin film of a passivation layer material is formed on the common electrode layer, and further, a layer of photoresist is coated on the thin film of the passivation layer material. As illustrated in FIG. 6, a layer of photoresist 10 is coated on a thin film 80 of a planarization layer material and a thin film 90 of a passivation layer material.

Step 208, the photoresist is subjected to exposure with a mask, and then development is conducted on the exposed photoresist, thereby forming a photoresist fully-retained region and a photoresist fully-removed region after development.

For example, the mask includes a fully-transmissive part corresponding to a fully-transmissive region and a light-tight part corresponding to a light-tight region.

The photoresist fully-removed region corresponds to a drain electrode region, and the rest region is the photoresist fully-retained region.

Figure 7:
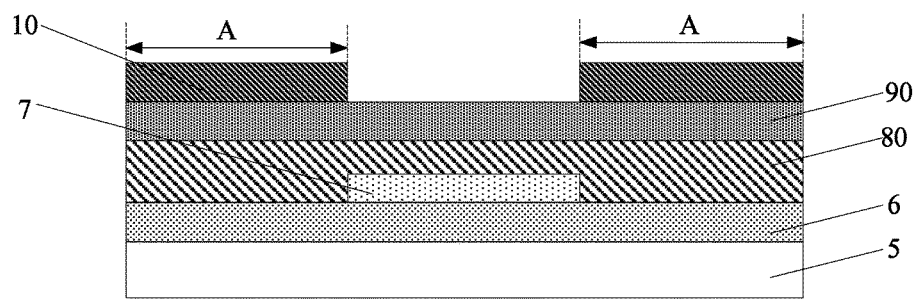
FIG. 7 is a schematic view after development is conducted on the photoresist in FIG. 6, during the course of manufacturing the array substrate as illustrated in FIG. 3a or FIG. 3b.

For example, as illustrated in FIG. 7, the photoresist fully-retained region is such as region 'A' illustrated in FIG. 7. As illustrated in FIG. 7, a thickness of the photoresist fully-retained region should be uniform as far as possible, and is an initial thickness of the photoresist after end of coating, and the photoresist in other region is fully removed.

Step 209, the thin film of the planarization layer material and the thin film of the passivation layer material are removed in the photoresist fully-removed region.

Figure 8:
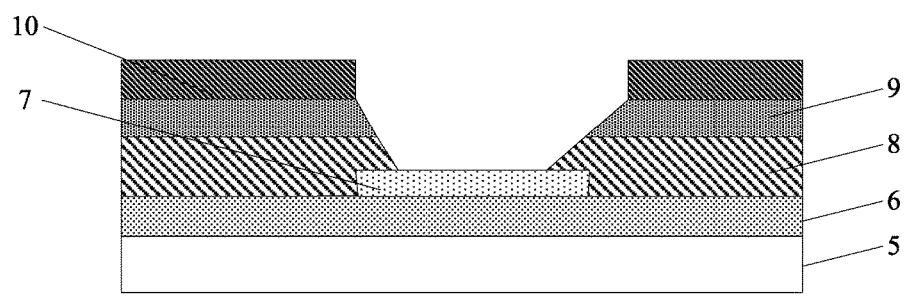
FIG. 8 is a schematic view after the thin film of the planarization layer material and the thin film of the passivation layer material provided in a photoresist fully-removed region are removed, during the course of manufacturing the array substrate as illustrated in FIG. 3a or FIG. 3b.

As illustrated in FIG. 8, for example, it is possible that regions of the thin film 80 of the planarization layer material and the thin film 90 of the passivation layer material that are not covered by photoresist are etched away with an etching solution, so that the thin film of the planarization layer material is formed to be a planarization layer 8, and thin film of the passivation layer material is formed to be a passivation layer 9.

Step 210, the remaining photoresist is removed.

Figure 9:
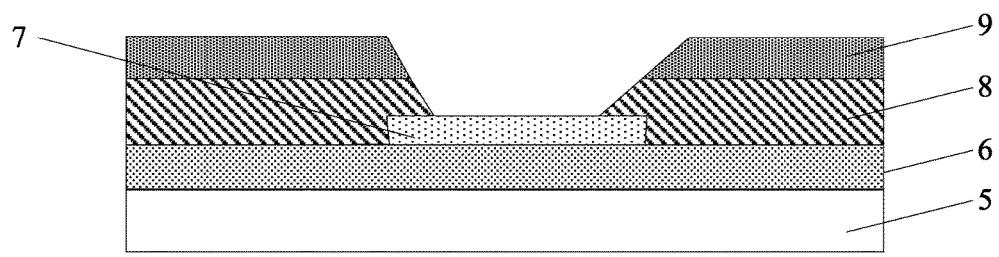
FIG. 9 is a schematic view after the photoresist is stripped off, during the course of manufacturing the array substrate as illustrated in FIG. 3a or FIG. 3b.

As illustrated in FIG. 9, namely, the retained photoresist is removed, so as to expose the planarization layer 4 and the passivation layer 5.

Step 211, a pattern of a pixel electrode layer connected to the drain electrode is formed on the pattern of the passivation layer.

For example, it is possible that ITO or IZO is deposited on the passivation layer by means of magnetron sputtering, and then is subjected to exposure, development and etching so as to form a pixel electrode layer.

For example, patterns of a passivation layer and a planarization layer in the embodiment of the invention are formed by one patterning process. For comparison, in the conventional example where a pattern of a passivation layer and a pattern of a planarization layer are formed separately, the size of a via hole at a region corresponding to a drain electrode formed each time has a certain deviation from the actually required size due to the constraints of the manufacturing process per se, and the size of the via hole at the region corresponding to the drain electrode formed by two patterning processes in this way will become larger. Certainly, no matter two via holes are in the configuration of a full-overlay hole manner or a half-overlay hole manner, the above issue will exist. The planarization layer and the passivation layer are formed by one patterning process in the embodiment, and as illustrated in FIG. 3a, the size of the resultant via hole 11 at the region corresponding to the drain electrode is reduced greatly, and thus, the aperture ratio also increases correspondingly.

Figure 10:
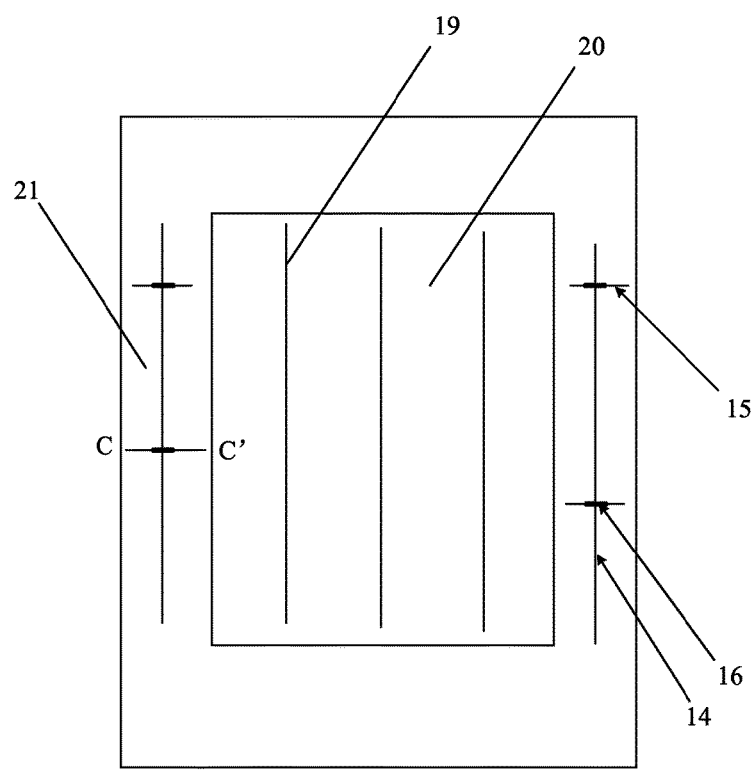
FIG. 10 is graphically schematic view illustrating a data-line layer at a display region and a peripheral region on a base substrate.
Figure 11:
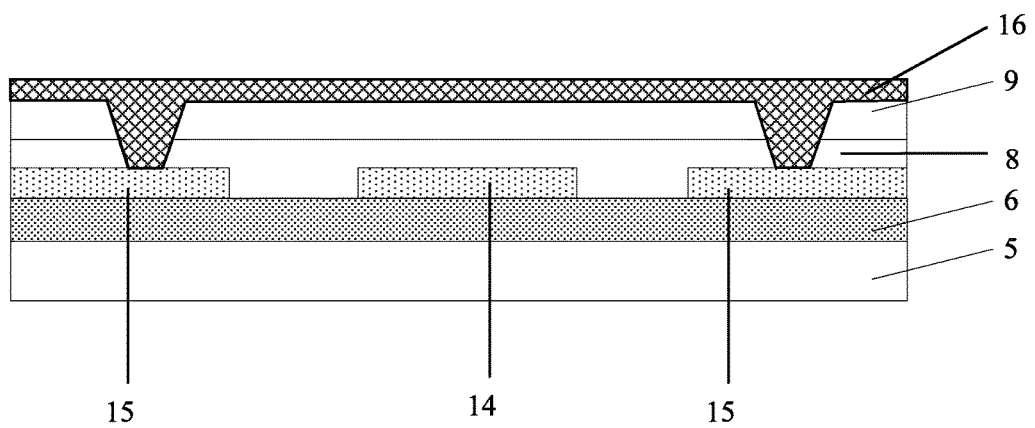
FIG. 11 is a schematic view taken along line C-C' in FIG. 10.

For example, a lead connection line of a pixel electrode layer may be used as a jumper/bridge, so as to achieve the change between different directions and crossing over wirings on the same layer. For example, as illustrated in FIG. 10, a display device (a base substrate) includes a display region 20 and a peripheral region 21, and the peripheral region 21 adjoins and surrounds the display region 20. For example, the method may further include forming a pattern of a data line layer, which includes a pattern 19 of the data line provided in the display region and a lead pattern provided in the peripheral region. The lead pattern in the peripheral region includes a lead pattern of the data line layer, and the lead pattern of the data line layer includes a plurality of first leads 15 arranged in a first direction and a plurality of second leads 14 arranged in a second direction. The first direction and the second direction are two different directions on a plane in parallel to the base substrate. For example, the connection between first leads 15 or second leads 14 of the data line layer is realized through a lead connection line 16 of the pixel electrode layer provided in the peripheral region. For example, a first lead 15 is disconnected at the crossing position with a second lead 14 and divided into two parts, as illustrated in FIGS. 10 and 11, the pixel electrode layer has a lead connection line provided in the peripheral region, and two parts of the first lead 15 that are disconnected at the crossing with the second lead 14 are joined by the lead connection line with the help of via holes. The via holes penetrate a planarization layer and a passivation layer, and the via holes may be formed by one patterning process as well.

For example, the pattern of a data line layer in embodiments of the invention may include a pattern of a source/drain electrode layer, namely, the pattern of the data line layer is disposed in the same layer as source and drain electrodes, or may include a pattern of a gate electrode layer, namely, the pattern of the data line layer is disposed in the same layer as a gate electrode, as long as the layer can be used to form a lead pattern in a peripheral region. For example, if the pattern of a data line layer is disposed in the same layer as source and drain electrodes, the pattern of a data line provided in a display region may be a data line connected to the source electrode, and in this case, the data line and source and drain electrodes may be disposed in the same layer. If the pattern of a data line layer is disposed in the same layer as a gate electrode, the pattern of a data line provided in a display region may be a gate line connected to the gate electrode, and in this case, the gate line and the gate electrode may be disposed in the same layer.

For example, it is also possible that a pixel electrode layer is used as a protective layer, so as to protect an underlying metal layer from being eroded. For example, in the case where a metal wire or a pad is exposed outside and moreover it is impossible to use such as a passivation layer to provided effective protection, a pixel electrode layer may be used as a protective layer to cover the metal wire or the pad so as to prevent oxidation.

It is to be noted that connection with a lead of a data line layer in peripheral circuitry of a display device is generally achieved with a common electrode layer. In embodiments of the invention, a pixel electrode layer is used for achieving connection with a lead of a data line layer in peripheral circuits of a display device. For example, conduction between leads of a data line layer in peripheral circuits of a display device is achieved by a part of a pixel electrode layer provided in the periphery.

It is also to be noted that, the connection between leads of a data line layer in peripheral circuitry may be understood as follows: leads of the data line layer are formed in the same layer and with the same material as data lines. The leads are arranged in the manner of crisscrossing in the peripheral circuits of the display device. Due to the impact of wiring space, when the leads crisscross with each other, there may be the case that a jumper/bridge wires are required, and in this case, it is necessary for the jumper wires to be connected with the aid of a conductive layer. In this way, even if the issue of jumper wires between leads of a data line layer in peripheral circuits is considered, the connection of leads of the data line layer can also be achieved favorably according to embodiments of the invention, and performance of the formed display device is still very good.

With respect to the manufacturing method of the array substrate provided by embodiments of the invention, a planarization layer and a passivation layer are formed by one patterning process. Compared with the common case where two patterning processes are required for formation of a planarization layer and a passivation layer, the number of patterning processes during the course of manufacturing the array substrate can be decreased. Furthermore, the size of via holes in the planarization layer and the passivation layer can be decreased, thereby increasing the aperture ratio of the display device, and enhancing the display effect of images.

According to an embodiment of the invention, there is provided an array substrate. As illustrated in FIG. 3b, the array substrate includes a thin film transistor, a planarization layer 8 and a passivation layer 9 that are provided on a base substrate 5. The thin film transistor includes a gate electrode 13, a gate insulation layer 6, an active layer 3, a source electrode 12 and a drain electrode 7, and the via holes in the planarization layer 8 and the passivation layer 9 in correspondence with the drain electrode 7 are smoothly connected.

Further, for example, the array substrate further includes a pixel electrode layer 4 disposed on the passivation layer 9 and connected to the drain electrode 7, a data line layer 2 disposed in the same layer as the source electrode 12 and the drain electrode 7, and a plurality of first leads 15 and a plurality of second leads 14 provided in a peripheral region and disposed in the same layer as the source electrode 12, the drain electrode 7 and the data line 2; connection between first leads or second leads of the data line layer 2 can be realized by a lead connection line of the pixel electrode layer 4 provided in a peripheral region. Regarding the first leads and the second leads, the descriptions regarding the manufacturing method of the array substrate and FIG. 10 and FIG. 11 can be referenced.

It is to be noted that, regarding description of relevant features in the array substrate in the present embodiment, the description in the above embodiments can be referenced, and details can be omitted here.

With respect to the array substrate provided by embodiments of the invention, a planarization layer and a passivation layer are formed by one patterning process, so that via holes in the planarization layer and the passivation layer in correspondence with a drain electrode are smoothly connected. Compared with the conventional case where two patterning processes are required for formation of a planarization layer and a passivation layer, the number of patterning processes during the course of manufacturing the array substrate can be decreased. Furthermore, the size of via holes in the planarization layer and the passivation layer can be decreased, thereby increasing the aperture ratio of the display device, and enhancing the display effect of images.

According to an embodiment of the invention, there is provided a display panel, which includes an array substrate provided by any of the above-mentioned embodiments.

For example, the display panel may be a display panel of a cell phone, a watch, a tablet computer, a television, a notebook computer, a digital photo frame, a navigator or any other product or component having a display function.

With respect to the display panel provided by embodiments of the invention, a planarization layer and a passivation layer are formed by one patterning process, and compared with the conventional case where two patterning processes are required for formation of a planarization layer and a passivation layer, the number of patterning processes during the course of manufacturing the array substrate can be decreased. Furthermore, the size of via holes in the planarization layer and the passivation layer can be decreased, thereby increasing the aperture ratio of the display device, and enhancing the display effect of images.

Descriptions made above are merely specific embodiments of the invention, but the protection scope of the invention is not limited thereto. Changes or replacements, as easily conceivable by those skilled in the art within the technical scope disclosed by the invention, shall be encompassed within the protection scope of the invention. Therefore, the protection scope of the invention shall be determined by the protection scope of attached claims.

This patent application claims the benefit of priority from Chinese patent application No. 201410768516.0, filed on Dec. 11, 2014, the disclosure of which is incorporated herein in its entirety by reference as a part of the present application.

What is claimed is:

1. A manufacturing method of an array substrate, comprising:
forming patterns of a thin film transistor, a planarization layer and a passivation layer on a base substrate, a pattern of the thin film transistor including patterns of a gate electrode, a gate insulation layer, an active layer and source and drain electrodes,
forming a pattern of a data line layer, the base substrate including a display region and a peripheral region that adjoins and surrounds the display region, the pattern of the data line layer including a pattern of a data line provided in the display region and a lead pattern provided in the peripheral region, the lead pattern of the data line layer including a plurality of first leads arranged along a first direction and a plurality of second leads arranged along a second direction, and the first direction and the second direction being two different directions on a plane in parallel to the base substrate,
wherein between the first leads or the second leads of the data line layer, a connection is realized by lead connection lines of the pixel electrode layer provided in the peripheral region,
wherein the first leads are disconnected and insulated from the second leads, the first leads or the second leads comprise disconnected portions, and the disconnected portions of the first leads or the second leads are connected by the lead connection lines of the pixel electrode layer provided in the peripheral region, and
wherein patterns of the planarization layer and the passivation layer are formed by one patterning process.

2. The method claimed as claim 1, further comprising, after the pattern of the passivation layer is formed, forming a pattern of a pixel electrode layer that is connected to the drain electrode.

3. The method claimed as claim 2, further comprising forming a pattern of a common electrode layer on the pattern of the planarization layer, wherein, forming of the patterns of the planarization layer and the passivation layer includes:
forming a thin film of a planarization layer material on the pattern of the thin film transistor;
forming a thin film of a passivation layer material on the pattern of the common electrode layer;
with one patterning process, forming the thin film of the planarization layer material to the pattern of the planarization layer, and forming the thin film of the passivation layer material to the pattern of the passivation layer.

4. The method claimed as claim 3, wherein forming of the patterns of the planarization layer and the passivation layer includes: forming a plurality of via holes in the thin film of the planarization layer material and the thin film of the passivation layer material.

5. The method claimed as claim 3, wherein forming of the thin film of the planarization layer material to a pattern of the planarization layer and the thin film of the passivation layer material to a pattern of the passivation layer with one patterning process includes:
coating a layer of photoresist on the substrate with the thin film of the planarization layer material and the thin film of the passivation layer formed thereon;
conducting exposure of the photoresist with a mask, and then performing development on the exposed photoresist, so that a photoresist fully-retained region and a photoresist fully-removed region are formed after development, wherein the photoresist fully-removed region corresponds to region of the drain electrode, and a rest region is the photoresist fully-retained region;
removing the thin film of the planarization layer material and the thin film of the passivation layer material provided in the photoresist fully-removed region; and
removing the remaining photoresist.

6. The method claimed as claim 1, further comprising forming a pattern of a common electrode layer on the pattern of the planarization layer, wherein, forming of the patterns of the planarization layer and the passivation layer includes:
forming a thin film of a planarization layer material on the pattern of the thin film transistor;
forming a thin film of a passivation layer material on the pattern of the common electrode layer;
with one patterning process, forming the thin film of the planarization layer material to the pattern of the planarization layer, and forming the thin film of the passivation layer material to the pattern of the passivation layer.

7. The method claimed as claim 6, wherein forming of the patterns of the planarization layer and the passivation layer includes: forming a plurality of via holes in the thin film of the planarization layer material and the thin film of the passivation layer material.

8. The method claimed as claim 7, further comprising:
forming a pattern of a common electrode layer with one patterning process on the thin film of the planarization layer material.

9. The method claimed as claim 6, wherein forming of the thin film of the planarization layer material to a pattern of the planarization layer and the thin film of the passivation layer material to a pattern of the passivation layer with one patterning process includes:
coating a layer of photoresist on the substrate with the thin film of the planarization layer material and the thin film of the passivation layer formed thereon;
conducting exposure of the photoresist with a mask, and then performing development on the exposed photoresist, so that a photoresist fully-retained region and a photoresist fully-removed region are formed after development, wherein the photoresist fully-removed region corresponds to region of the drain electrode, and a rest region is the photoresist fully-retained region;
removing the thin film of the planarization layer material and the thin film of the passivation layer material provided in the photoresist fully-removed region; and
removing the remaining photoresist.

10. The method claimed as claim 1, wherein a material for the planarization layer is a resin material.

11. The method claimed as claim 1, wherein a material for the passivation layer is silicon nitride or a transparent, organic resin material.

12. The method claimed as claim 1, further comprising forming a pattern of a common electrode layer on the pattern of the planarization layer, wherein, forming of the patterns of the planarization layer and the passivation layer includes:
forming a thin film of a planarization layer material on the pattern of the thin film transistor;
forming a thin film of a passivation layer material on the pattern of the common electrode layer;
with one patterning process, forming the thin film of the planarization layer material to the pattern of the planarization layer, and forming the thin film of the passivation layer material to the pattern of the passivation layer.

13. The method claimed as claim 12, wherein forming of the patterns of the planarization layer and the passivation layer includes: forming a plurality of via holes in the thin film of the planarization layer material and the thin film of the passivation layer material.

14. The method claimed as claim 12, wherein forming of the thin film of the planarization layer material to a pattern of the planarization layer and the thin film of the passivation layer material to a pattern of the passivation layer with one patterning process includes:

coating a layer of photoresist on the substrate with the thin film of the planarization layer material and the thin film of the passivation layer formed thereon;

conducting exposure of the photoresist with a mask, and then performing development on the exposed photoresist, so that a photoresist fully-retained region and a photoresist fully-removed region are formed after development, wherein the photoresist fully-removed region corresponds to region of the drain electrode, and a rest region is the photoresist fully-retained region;

removing the thin film of the planarization layer material and the thin film of the passivation layer material provided in the photoresist fully-removed region; and removing the remaining photoresist.

15. An array substrate, comprising: a thin film transistor, a planarization layer and a passivation layer that are disposed on a base substrate, the thin film transistor including a gate electrode, a gate insulation layer, an active layer, and source and drain electrodes; a pixel electrode layer disposed on the passivation layer and connected to the drain electrode and a pattern of a data line layer disposed on the base substrate, the base substrate including a display region and a peripheral region that adjoins and surrounds the display region, the pattern of the data line layer including a pattern of a data line provided in the display region and a lead pattern provided in the peripheral region, the lead pattern of the data line layer including a plurality of first leads arranged along a first direction and a plurality of second leads arranged along a second direction, and the first direction and the second direction being two different directions on a plane in parallel to the base substrate, wherein via holes in the planarization layer and the passivation layer in correspondence with the drain electrode are smoothly connected and between the first leads or the second leads of the data line layer, connection is realized by lead connection lines of the pixel electrode layer provided in the peripheral region, wherein the first leads are disconnected and insulated from the second leads, the first leads or the second leads comprise disconnected portions, and the disconnected portions of the first leads or the second leads are connected by the lead connection lines of the pixel electrode layer provided in the peripheral region.

16. The array substrate claimed as claim 15, wherein the pattern of the data line layer is disposed in the same layer as the source and drain electrodes.

17. The array substrate claimed as claim 15, wherein the pattern of the data line layer is disposed in the same layer as the gate electrode.

18. A display panel, comprising the array substrate claimed as claim 15.

* * * * *